United States Patent
Burr (10) Patent No.: US 6,489,224 B1
(45) Date of Patent: Dec. 3, 2002

(54) METHOD FOR ENGINEERING THE THRESHOLD VOLTAGE OF A DEVICE USING BURIED WELLS

(75) Inventor: James B. Burr, Foster City, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 09/872,419

(22) Filed: May 31, 2001

(51) Int. Cl.[7] .............................................. H01L 21/425
(52) U.S. Cl. ........................................ 438/526; 438/217
(58) Field of Search ............................. 438/217, 241, 438/275, 289, 305, 526, 696, 787, 791, 981

(56) References Cited

U.S. PATENT DOCUMENTS

| | | | |
|---|---|---|---|
| 4,365,172 A | 12/1982 | Prater | 307/270 |
| 4,700,212 A | 10/1987 | Okazawa | 357/41 |
| 5,362,981 A | 11/1994 | Sato et al. | 257/371 |
| 5,471,421 A | 11/1995 | Rose et al. | 365/182 |
| 5,566,120 A | 10/1996 | D'Souza | 365/227 |
| 5,581,500 A | 12/1996 | D'Souza | 365/154 |
| 5,594,371 A | 1/1997 | Douseki | 326/119 |
| 5,606,270 A | 2/1997 | D'Souza et al. | 326/98 |
| 5,612,645 A | 3/1997 | Halepete | 327/537 |
| 5,622,880 A | 4/1997 | Burr et al. | 438/194 |
| 5,640,115 A | 6/1997 | Halepete et al. | 327/219 |
| 5,650,340 A | 7/1997 | Burre et al. | 437/30 |
| 5,675,172 A | 10/1997 | Miyamoto et al. | 257/402 |
| 5,719,422 A | 2/1998 | Burr et al. | 257/336 |
| 5,726,477 A | 3/1998 | Williams et al. | 257/402 |
| 5,751,170 A | 5/1998 | Pyeon | 327/57 |
| 5,753,958 A | 5/1998 | Burr et al. | 257/392 |
| 5,773,863 A | 6/1998 | Burr et al. | 257/344 |
| 5,780,912 A | 7/1998 | Burr et al. | 257/408 |
| 5,783,958 A | 7/1998 | Lysinger | 327/202 |
| 5,811,871 A | 9/1998 | Nakashima | 257/565 |
| 5,916,237 A | 6/1999 | Schu | 607/2 |
| 5,923,987 A | 7/1999 | Burr | 438/304 |
| 5,930,642 A * | 7/1999 | Moore et al. | 438/407 |
| 5,939,757 A * | 8/1999 | Kim | 257/371 |
| 5,942,781 A | 8/1999 | Burr et al. | 257/347 |
| 5,982,211 A | 11/1999 | Ko | 327/202 |
| 5,985,705 A | 11/1999 | Seliskar | 438/197 |
| 5,985,727 A | 11/1999 | Burr | 438/302 |
| 5,998,850 A | 12/1999 | Burr | 257/428 |
| 6,031,778 A | 2/2000 | Makino et al. | 365/226 |
| 6,048,746 A | 4/2000 | Burr | 438/17 |
| 6,072,217 A | 6/2000 | Burr | 257/351 |
| 6,087,892 A | 7/2000 | Burr | 327/534 |
| 6,091,283 A | 7/2000 | Murgula et al. | 327/537 |
| 6,093,951 A | 7/2000 | Burr | 257/408 |
| 6,100,567 A | 8/2000 | Burr | 257/365 |
| 6,110,783 A | 8/2000 | Burr | 438/286 |
| 6,118,328 A | 9/2000 | Morikawa | 327/534 |
| 6,121,666 A | 9/2000 | Burr | 257/408 |
| 6,133,762 A | 10/2000 | Hill et al. | 326/119 |
| 6,137,142 A | 10/2000 | Burr | 257/349 |
| 6,144,079 A | 11/2000 | Shirahata et al. | 257/392 |
| 6,180,443 B1 * | 1/2001 | Kang et al. | 438/217 |

(List continued on next page.)

Primary Examiner—David Nelms
Assistant Examiner—Phuc T. Dang
(74) Attorney, Agent, or Firm—Gunnison, McKay & Hodgson, L.L.P.; Philip J. McKay (57) ABSTRACT

Buried platform wells are specifically used to electrically interact with the platform transistors of the invention. The dopant concentration distribution of the buried platform wells is used to change the threshold voltage of the platform transistors of the invention by introducing a tail dopant concentration into the active region of the platform transistors. The platform transistors of the invention can also be used in conjunction with standard transistors, on a single structure, to provide both low and relatively high threshold voltage transistors on a single structure. Consequently, using the method and structure of the invention, considerable versatility and design flexibility are achieved with minimum additional structural complexity.

18 Claims, 9 Drawing Sheets

U.S. PATENT DOCUMENTS

| | | | |
|---|---|---|---|
| 6,190,954 B1 | 2/2001 | Lee et al. | 438/199 |
| 6,211,003 B1 * | 4/2001 | Taniguchi et al. | 438/228 |
| 6,211,725 B1 | 4/2001 | Kang | 327/534 |
| 6,231,147 B1 | 5/2001 | Bosshart | 327/212 |
| 6,255,853 B1 | 7/2001 | Houston | 326/98 |
| 6,287,912 B1 * | 9/2001 | Asakura et al. | 438/241 |
| 6,310,487 B1 | 10/2001 | Yokomizo | 324/769 |
| 6,329,874 B1 | 12/2001 | Ye et al. | 327/544 |

* cited by examiner

METHOD FOR ENGINEERING THE THRESHOLD VOLTAGE OF A DEVICE USING BURIED WELLS

FIELD OF THE INVENTION

The present invention relates generally to transistor devices and, more particularly, to low power and ultra-low power transistor devices.

BACKGROUND OF THE INVENTION

In modern computer systems, power density and scalability issues represent some of the most significant obstacles to increased system performance. For reliability, the supply voltage Vdd must come down. In addition, to control leakage current, the threshold voltage must come up. Consequently, performance is being rapidly squeezed between the two. In addition, with an electronics market that stresses portability, compact size, lightweight and the capability for prolonged remote operation, a demand has arisen for low power and ultra-low power transistor devices and systems. To meet this demand devices are emerging which have extremely low threshold voltages.

Figure 1A:
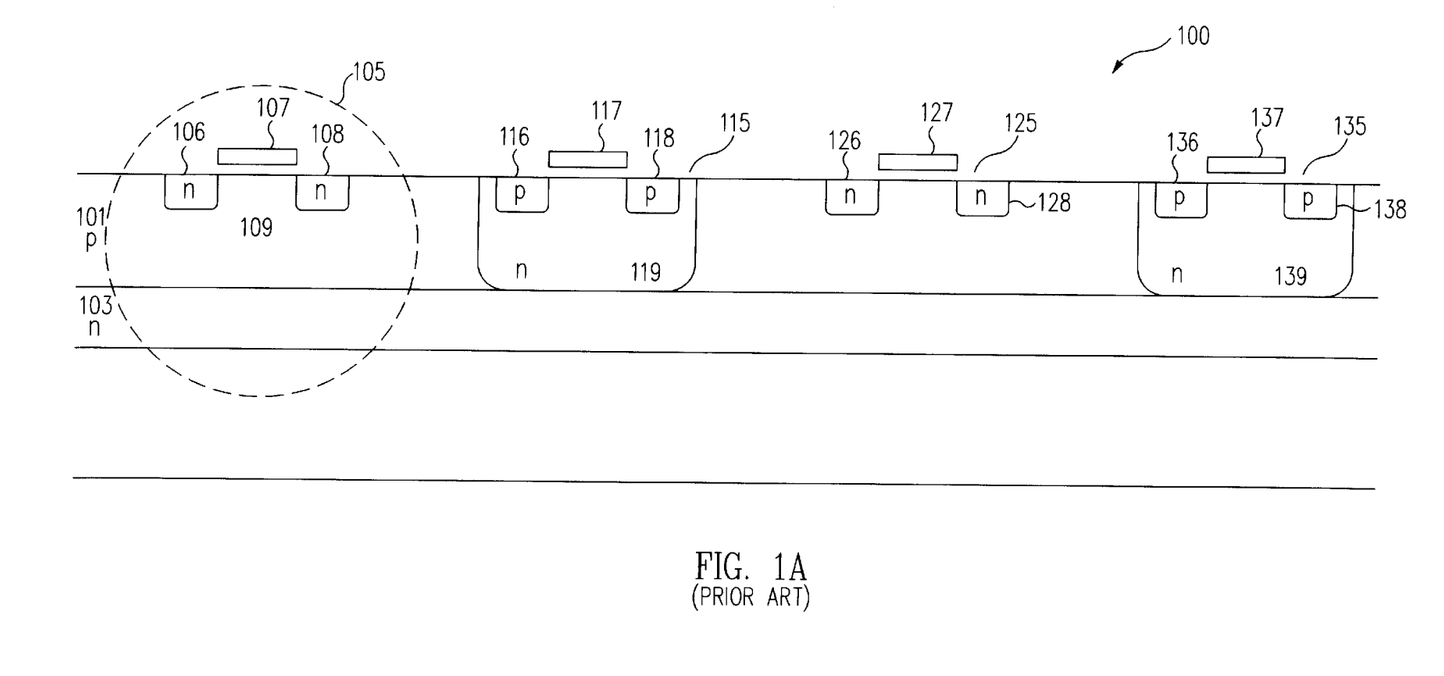
FIG. 1A shows a typical prior art buried well structure including two standard NFET transistors and two standard PFET transistors.

In the prior art, devices were introduced that included buried wells. Typically these buried wells were N-type buried wells that were used for connecting N-wells surrounding PFET devices. FIG. 1A illustrates a prior art structure 100. Prior art structure 100 included a P-type substrate 101. A first NFET 105 was formed in P-type substrate 101 and included N-type source 106, N-type drain 108, gate electrode 107, and active region 109. P-type substrate 101 also included a first N-well 119 with first PFET 115 formed in it. First PFET 115 included P-type source 116, P-type drain 118 and gate electrode 117. A second NFET 125 including N-type source 126, N-type drain 128 and gate electrode 127 was also formed in P-type substrate 101. In addition, a second PFET 135 was formed in second N-well 139 and included P-type source 136, P-type drain 138 and gate electrode 137. Prior art structure 100 also included buried N-type well 103, or buried N-well 103, that was positioned below transistors 105, 115, 125 and 135 and connected N-wells 119 and 139 of PFETs 115 and 135.

According to the prior art, the sole purpose of buried N-well 103 was to connect N-type wells 119 and 139 of PFETs 115 and 135 with other N-type wells (not shown) and other PFETs (not shown) that were formed in prior art structure 100. For a more detailed discussion of prior art buried wells and their structures and purpose, see the related Patents listed below, all of which list the inventor of the present invention and are assigned to the assignee of the present invention, and are incorporated herein, in their entirety, by reference.

As noted above, according to the teachings of the prior art, buried N-well 103 was used strictly to interconnect N-wells 119 and 139 of PFETs 115 and 135. Consequently, in the prior art, it was specifically taught to minimize and, if possible, eliminate all electrical interaction of buried N-well 103 with transistors 105, 115, 125, and 135. In the prior art, a great deal of energy and thought was devoted to this goal and it was taught that, ideally, there should be no interaction between buried N-well 103 and any of the transistors. In other words, in the prior art, N-well 103 was not considered an element, or a factor, in engineering the operation or threshold voltage of transistors 105, 115, 125 and 135. To this end, in the prior art, great care was taken to use the correct energies and dopant concentrations in forming buried N-well 103 to try to obtain an ideal dopant concentration distribution for buried N-well 103.

Figure 1B:
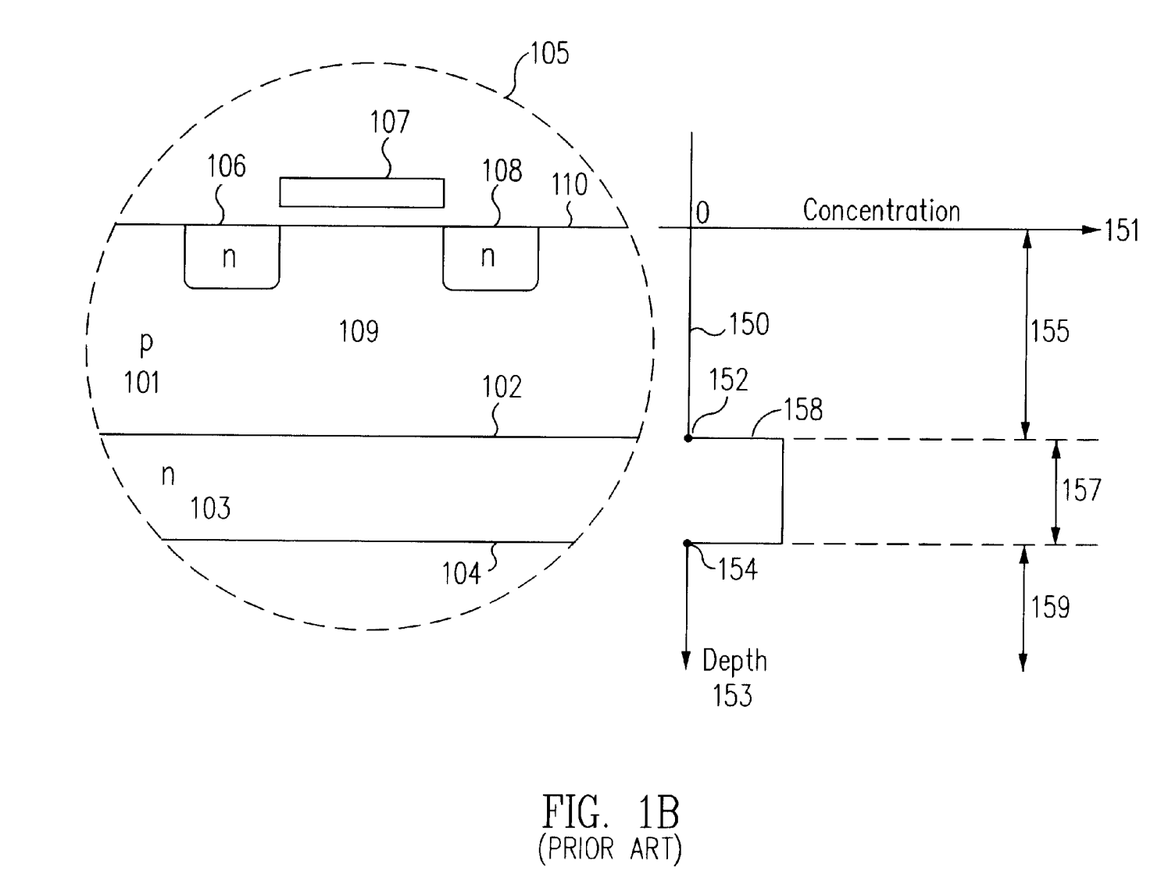
FIG. 1B shows a standard NFET of FIG. 1A in detail along with an ideal graph of the dopant concentration, along the horizontal axis, versus the depth below the top surface of the NFET, along the vertical axis.

FIG. 1B shows NFET 105 of FIG. 1A in detail along with a graph of the dopant concentration, along horizontal axis 151, versus the depth below surface 110 of NFET 105, along vertical axis 153. FIG. 1B shows an idealized curve 150 of the prior art ideal dopant concentration distribution for NFET 105. As seen in FIG. 1B, in the prior art, ideally, there was no dopant in region 155 of curve 150, i.e., the dopant concentration was ideally zero until the first surface 102 of buried N-well 103. Then at depth 152, corresponding to the depth of first surface 102 of buried N-well 103, there would ideally be an immediate increase in dopant concentration to form pulse 158. In the prior art, it was taught that, ideally, the dopant concentration would remain high through region 157 until depth 154, the depth corresponding to the depth of second surface 104 of buried N-well 103, was reached. According to the prior art, ideally, the dopant concentration would then immediately drop back to zero at second surface 104 of buried N-well 103, and remain at zero throughout portion 159 of curve 150.

Figure 1C:
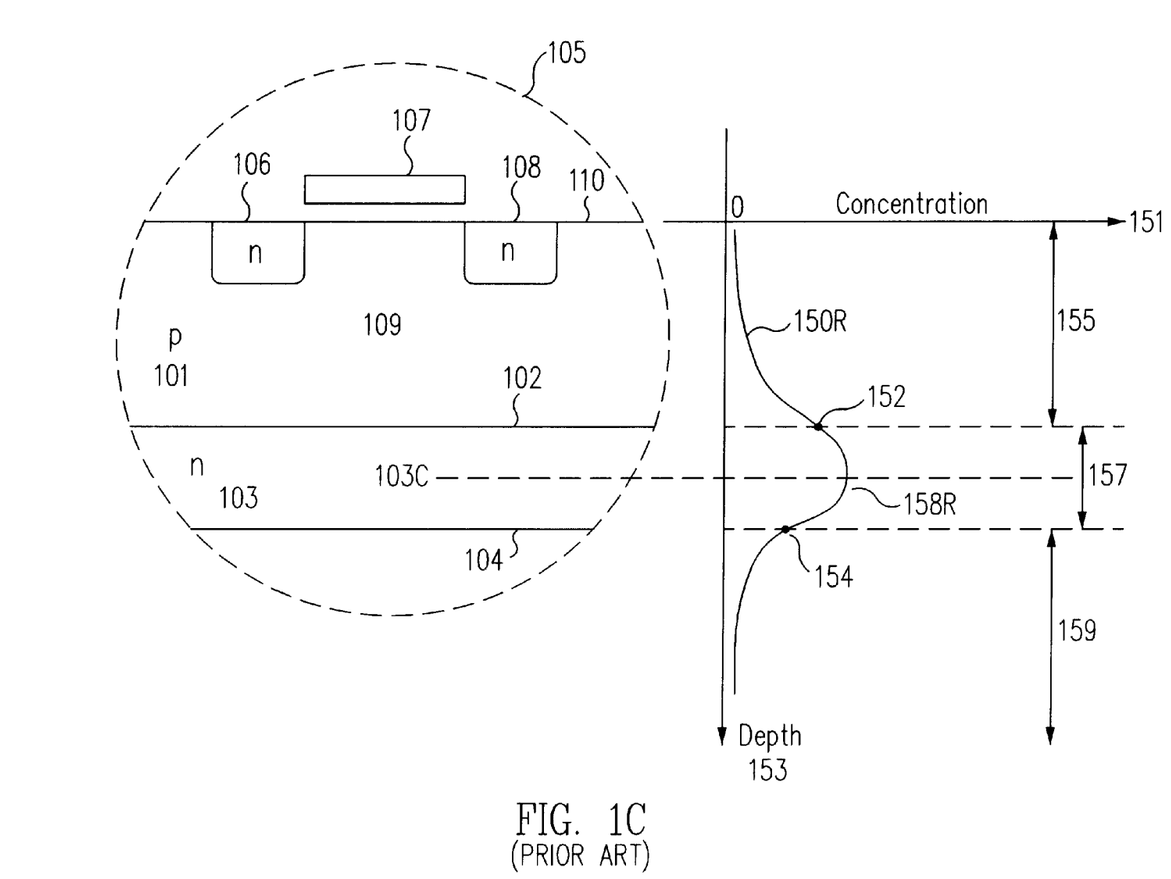
FIG. 1C shows a standard NFET of FIG. 1A and FIG. 1B in detail along with a more realistic graph of the dopant concentration, along the horizontal axis, versus the depth below the top surface of the NFET, along the vertical axis.

As noted above, FIG. 1B represents an ideal dopant concentration distribution as taught by the prior art. However, in actual practice, this ideal dopant concentration distribution was not obtainable and, in reality, the dopant concentration was more of a Gaussian distribution centered on the centerline of buried N-well 103. FIG. 1C shows NFET 105 of FIG. 1A and FIG. 1B in detail along with a more realistic graph of the dopant concentration, along horizontal axis 151, versus the depth below surface 110 of NFET 105, along vertical axis 153. FIG. 1C shows a realistic curve 150R of the dopant concentration distribution for NFET 105. As seen in FIG. 1C, there is a small dopant concentration in region 155 of curve 150R, i.e., a dopant concentration tail exists in region 155. This small dopant concentration in region 155 of curve 150R typically increases with depth throughout region 155, and the first half of region 157, of curve 150R, through and past the first surface 102 of buried N-well 103, to the depth of centerline 103C of buried N-well 103. The dopant concentration then typically reaches a peak 158R at a depth approximately equal to the depth of centerline 103C of buried N-well 103. After peak 158R, the dopant concentration typically decreases with depth along curve 150R through the second half of region 157, and all of region 159, i.e., a dopant concentration tail exists in region 159.

As noted above, the Gaussian distribution of FIG. 1C was considered problematic in the prior art and considerable energy was spent trying to obtain a dopant concentration distribution closer to the graph of FIG. 1B than that of FIG. 1C. This was because, as discussed above, in the prior art, it was thought that ideally, there should be no interaction between buried N-well 103 and NFET 105.

What is needed is a method and structure that operates well under realistic conditions. In addition, a method and structure is highly desirable that uses the non-ideal dopant concentration, and dopant concentration tail, as a tool for engineering the threshold voltage of the transistor.

SUMMARY OF THE INVENTION

In contrast to the structures and teachings of the prior art, the present invention includes a method and structure for using buried platform wells specifically to electrically interact with the platform transistors of the invention. According to the invention, the dopant concentration distribution of the buried platform wells is used to change the threshold voltage of the platform transistors of the invention by introducing a tail dopant concentration into the active region of the platform transistors.

Further, according to the invention, the tail dopant concentration distribution can be engineered to yield a desired threshold voltage for the platform transistor and this threshold voltage can be varied from transistor to transistor. Consequently, according to the method and structure of the invention, the Gaussian dopant concentration distribution that was avoided, minimized, and considered undesirable, in the prior art, is used as an advantageous integral element of the platform transistors of the invention.

The platform transistors of the invention can also be used in conjunction with standard transistors, on a single structure, to provide both low and relatively high threshold voltage transistors on a single structure. As a result of these and other features discussed in more detail above, devices designed according to the principles of the present invention have the desirable attributes of multiple threshold voltages that can be engineered to yield specific results and, using the method and structure of the invention, considerable versatility and design flexibility are achieved with minimum additional structural complexity.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Recall that, according to the prior art, the purpose of buried N-wells was to connect N-type wells containing PFETs. Consequently, in the prior art, it was specifically taught to minimize and, if possible, eliminate all electrical interaction of the buried N-wells with the transistors in the structure. In other words, in the prior art, buried N-wells were not considered an element, or a factor, in the engineering the operation or threshold voltage of transistors. Further, recall that, in the prior art, great care was taken to use the correct energies and dopant concentrations in forming buried N-wells to try to obtain an ideal dopant concentration pulse and avoid, or minimize, Gaussian dopant concentration distributions.

In contrast to the structures and teachings of the prior art, the present invention includes a method and structure for using buried platform wells (203 in FIG. 2B and 303 in FIG. 3B) specifically to electrically interact with the platform transistors (205 in FIGS. 2A and 2B and 315 in FIGS. 3A and 3B) of the invention. According to the invention, the dopant concentration distribution (250 in FIG. 2B and 350 in FIG. 3B) of the buried platform wells is used to change the threshold voltage of the platform transistors of the invention by introducing a tail dopant concentration into the active region (209 in FIG. 2B and 309 in FIG. 3B) of the platform transistors.

Further, according to the invention, the tail dopant concentration distribution can be engineered to yield a desired threshold voltage for the platform transistor and this threshold voltage can be varied from transistor to transistor. Consequently, according to the method and structure of the invention, the Gaussian dopant concentration distribution that was avoided, minimized, and considered undesirable, in the prior art is used as an advantageous integral element of the platform transistors of the invention.

The platform transistors of the invention can also be used in conjunction with standard transistors (225 in FIG. 2A and 425 and 435 in FIG. 4), on a single structure (200A in FIG. 2A and 400 In FIG. 4), to provide both relatively low and relatively high threshold voltage transistors on a single structure. As a result of these and other features discussed in more detail above, devices designed according to the principles of the present invention have the desirable attributes of multiple threshold voltages that can be engineered to yield specific results and, using the method and structure of the invention, considerable versatility and design flexibility are achieved with minimum additional structural complexity.

Figure 2A:
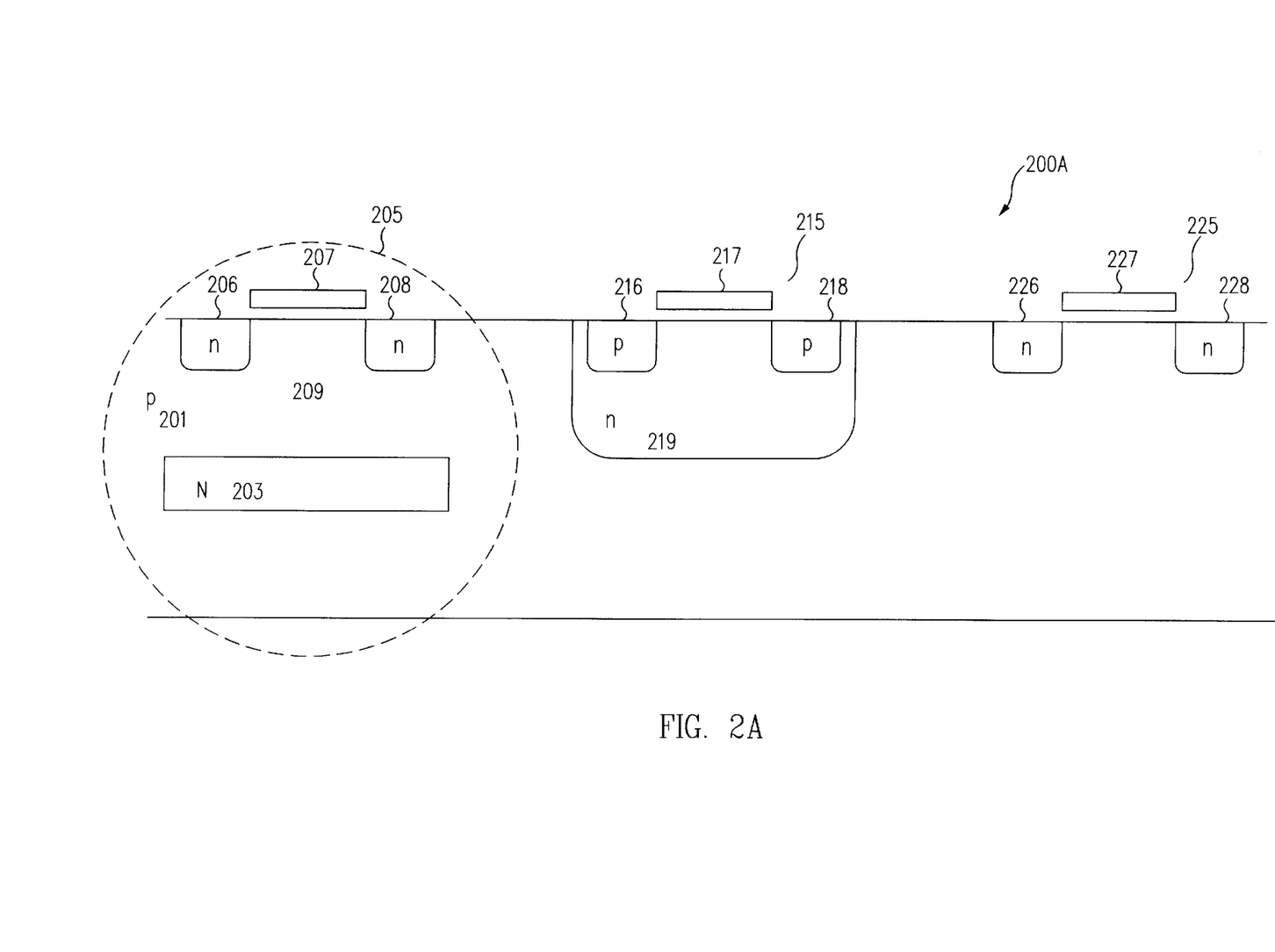
FIG. 2A shows one embodiment of structure 200A including: a platform NFET transistor in accordance with the principles of the invention; a standard PFET; and a standard NFET.

FIG. 2A shows one embodiment of a structure 200A, according to one embodiment of the invention, that includes:

a platform NFET transistor 205 formed in accordance with the principles of the invention; a standard PFET 215; and a standard NFET 225.

As shown in FIG. 2A, structure 200A includes a P-type substrate 201. A first N-well 219 is formed in P-type substrate 201. PFET 215 is formed in first N-well 219. PFET 215 includes P-type source 216, P-type drain 218 and gate electrode 217. An NFET 225 including N-type source 226, N-type drain 228 and gate electrode 227 is also formed in P-type substrate 201.

Importantly, according to the invention, a platform transistor, platform NFET 205, is formed in P-type substrate 201. Platform NFET 205 includes N-type source 206, N-type drain 208, gate electrode 207, and active region 209. In addition, platform NFET 205 also includes buried platform N-well 203, positioned below platform NFET 205. As seen in FIG. 2A, and in contrast to the prior art, buried platform N-well 203 does not connect N-well 219 with any other structure, such as another N-well, nor does buried platform N-well 203 lie below N-well 219 and PFET 215 at all. Instead, according to the invention, buried platform N-well 203 lies beneath platform NFET 205 and: is specifically designed to electrically interact with platform NFET 205; is an integral component of platform NFET 205; and is a tool to help engineer the threshold voltage of platform NFET 205.

Recall that, according to the prior art, the sole purpose of buried N-well 103 (FIG. 1A) was to connect N-type wells 119 and 139 of PFETs 115 and 135 with other N-type wells (not shown) and other PFETs (not shown) that were formed in prior art structure 100. Consequently, in the prior art, it was specifically taught to minimize and, if possible, eliminate all electrical interaction of buried N-well 103 with transistors 105, 115, 125, and 135. In other words, in the prior art, N-well 103 was not considered an element, or a factor, in engineering the operation or threshold voltage of transistors 105, 115, 125 and 135. Further, recall that, in the prior art, great care was taken to use the correct energies and dopant concentrations in forming buried N-well 103 to try to obtain an ideal dopant concentration for buried N-well 103 (see FIG. 1B and the discussion above).

In contrast to the prior art, according to the invention, buried platform N-well 203 (FIG. 2A) is specifically used to interact with platform NFET 205 and, in one embodiment, lower the threshold voltage of platform NFET 205 by introducing a tail dopant concentration distribution into active region 209 of platform NFET 205. Further, according to the invention, the tail dopant concentration distribution is engineered to yield the desired threshold voltage for platform NFET 205. Consequently, according to the method and structure of the invention, the Gaussian dopant concentration distribution that was avoided and considered undesirable in the prior art, is used as an advantageous integral element of platform NFET 205.

Figure 2B:
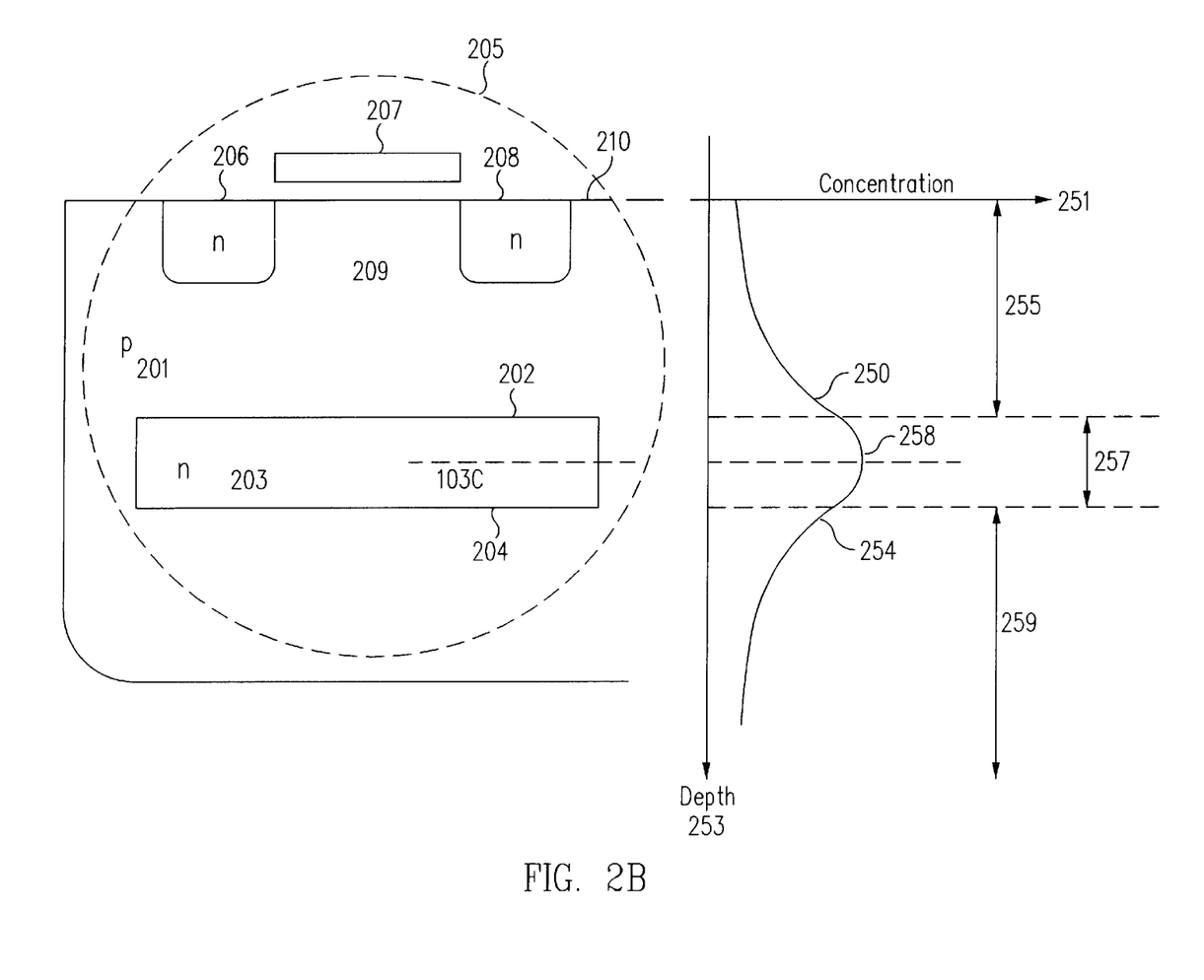
FIG. 2B shows one embodiment of a platform NFET transistor in accordance with the principles of the invention in detail along with a realistic graph of the dopant concentration, along the horizontal axis, versus the depth below the top surface of the NFET, along the vertical axis.

FIG. 2B shows platform NFET 205 of FIG. 2A in detail along with a graph of the engineered dopant concentration, along the horizontal axis 251, versus the depth below the top surface 210 of NFET 205, along the vertical axis 253. FIG. 2B shows an engineered curve 250 of the dopant concentration distribution for platform NFET 205. As seen in FIG. 2B, there is a small dopant concentration in region 255 of curve 250, i.e., a dopant concentration tail exists in region 255.

According to the invention, and in contrast to the prior art, the dopant concentration in region 255 of curve 250 is desired and, in one embodiment, is engineered to provide specific results. In one embodiment of the invention, dopant (not shown) of a specific dose and energy is applied to provide the desired level of dopant concentration in region 255 of curve 250. This process is well known to those of skill in the art and the specific dose and energy employed will vary according to the desired results. These desired results can be further refined by: using multiple implants; varying the dose; varying the energy; changing dopant species; changing the dopant polarity; varying the implant angle; and varying the substrate temperature during implantation.

Regardless of the specific dopant concentration engineered in region 255 of curve 250, the dopant concentration typically increases with depth throughout region 255, and the first half of region 257, of curve 250, through and past the first surface 202 of buried platform N-well 203, to the depth of centerline 203C of buried platform N-well 203. The dopant concentration then typically reaches a peak 258 at a depth approximately equal to the depth of a centerline 203C of buried platform N-well 203. After peak 258, the dopant concentration typically decreases with depth along curve 250 through the second half of region 257, and all of region 259, i.e., a dopant concentration tail exists in region 259.

As noted above, the Gaussian distribution of FIG. 1C was considered problematic in the prior art and considerable energy was spent trying to obtain a dopant concentration distribution closer to the graph of FIG. 1B than that of FIG. 1C or 2B. This was because, as discussed above, in the prior art, it was thought that ideally, there should be no interaction between buried N-well 103 and NFET 105.

In contrast, according to the present invention, the Gaussian distribution of FIG. 2B is specifically embraced and specifically engineered to electrically interact with platform NFET 205 and change the threshold voltage of platform NFET 205. For instance, for the embodiment shown in FIG. 2B, since platform NFET 205 is an NFET, if the dopant used is N-type, the dopant tail in region 255 of curve 250 lowers the threshold voltage of platform NFET 205 by making active region 209 more negative. Consequently, buried platform N-well 203 is an integral component of platform NFET 205 and is used as a tool to engineer, i.e., lower, the threshold voltage of platform NFET 205. Consequently, platform NFET 205 is a faster and lower power transistor than a non-platform transistor.

As discussed above, according to one embodiment of the invention, buried platform N-well 203 is used to lower the threshold voltage of platform NFET 205 and lowering the threshold voltage of a device typically decreases active power dissipation by permitting the same performance to be achieved at a lower supply voltage. However, lowering the threshold voltage of a device, such as platform NFET 205, normally increases standby power dissipation by increasing device leakage and devices having low threshold voltages can leak so much current when their circuits are in a sleep or standby mode that the gains made by lowering the threshold voltage are outweighed by the power lost to leakage. Consequently, it is often desirable to have a combination of low threshold devices and higher threshold devices in a single structure. Using the method and structure of the invention, this is readily accomplished.

Returning to FIG. 2A, note that structure 200A includes both platform NFET 205 and standard NFET 225. Since standard NFET 225 does not include a buried platform N-well 203, standard NFET 225 typically has a higher threshold voltage than platform NFET 205. Consequently, according to the invention, structure 200A includes two types of NFET transistors: a faster, but leaky, low threshold, platform NFET 205; and a slower, more stable, higher threshold standard NFET 225. As a result, a component can be designed using structure 200A that includes time critical subsystems (not shown) comprised of platform NFETs 205 and less time sensitive subsystems (not shown) comprised of standard NFETs 225. Thus, the method and structure of the invention provides a new versatility and design capability not present in prior art structures.

Figure 2C:
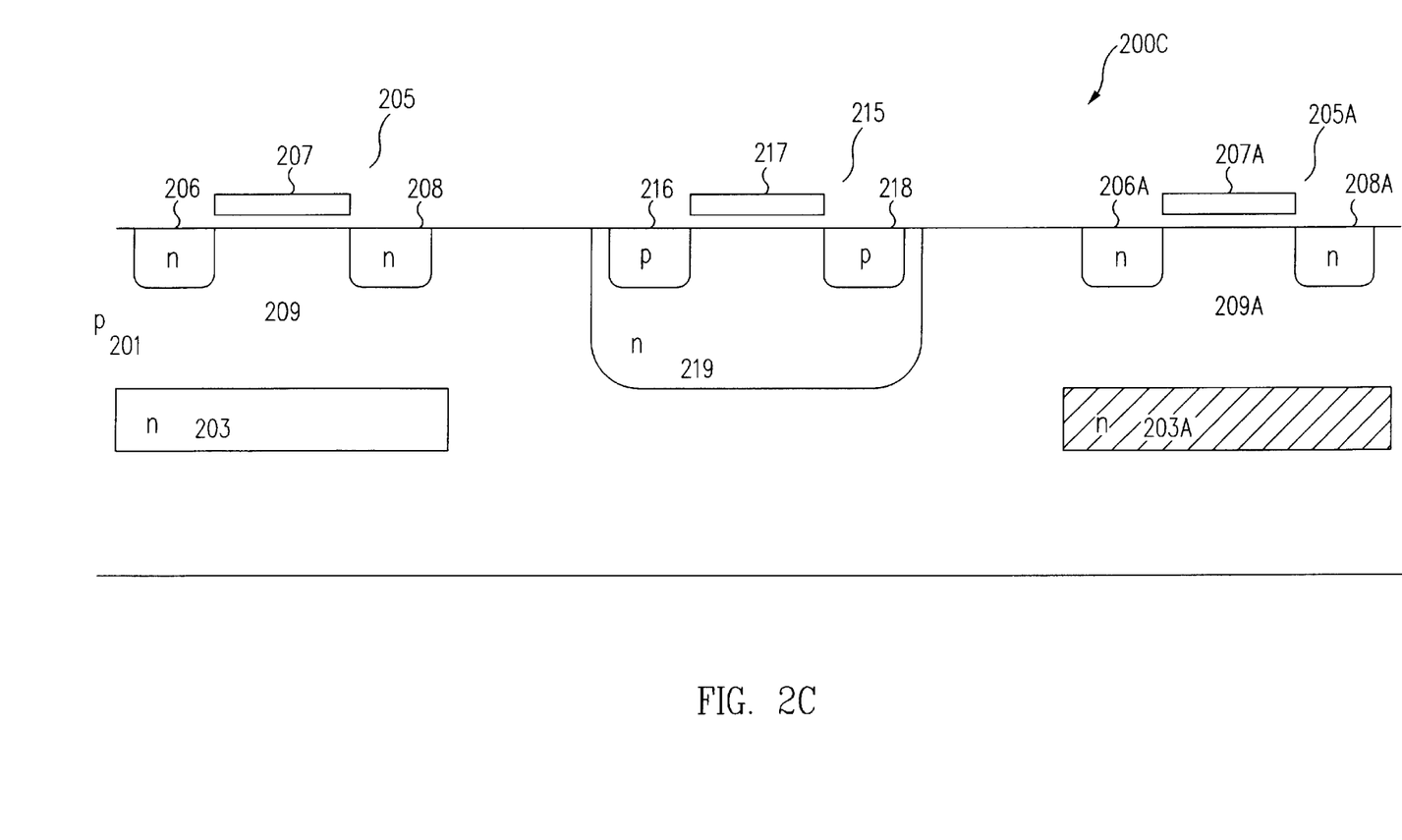
FIG. 2C shows a structure including: a platform NFET transistor formed in accordance with the principles of the invention to have a first threshold voltage; a standard PFET; and a standard NFET having a second threshold voltage in accordance with the principles of one embodiment the invention.

In addition, FIG. 2C shows a structure 200C that includes two platform NFETS, 205 and 205A, and a PFET 215. According to this embodiment of the invention, structure 200C includes: first platform NFET 205 formed in accordance with the principles of the invention to have a first threshold voltage and including N-type source 206, N-type drain 208 and gate electrode 207; standard PFET 215 formed in N-well 219 and including P-type source 216, P-type drain 218 and gate electrode 217; and second platform NFET 205A formed in accordance with the principles of the invention to have a second threshold voltage and including N-type source 206A, N-type drain 208A and gate electrode 207A.

In structure 200C, the buried platform N-wells 203 and 203A are engineered to have different dopant concentration distributions and, as a result, the dopant concentration in the active region 209 of platform NFET 205 is different from the dopant concentration in active region 209A of platform NFET 205A. Consequently, platform NFET 205 will typically have a threshold voltage either higher or lower than the threshold voltage of platform NFET 205A. In this manner, the method and structure of the invention can be used to create structure 200C with multiple types of platform NFETs 205 and 205A, having multiple threshold voltages. Therefore, using this embodiment of the invention the versatility and design capability is even further expanded over the prior art.

Figure 3A:
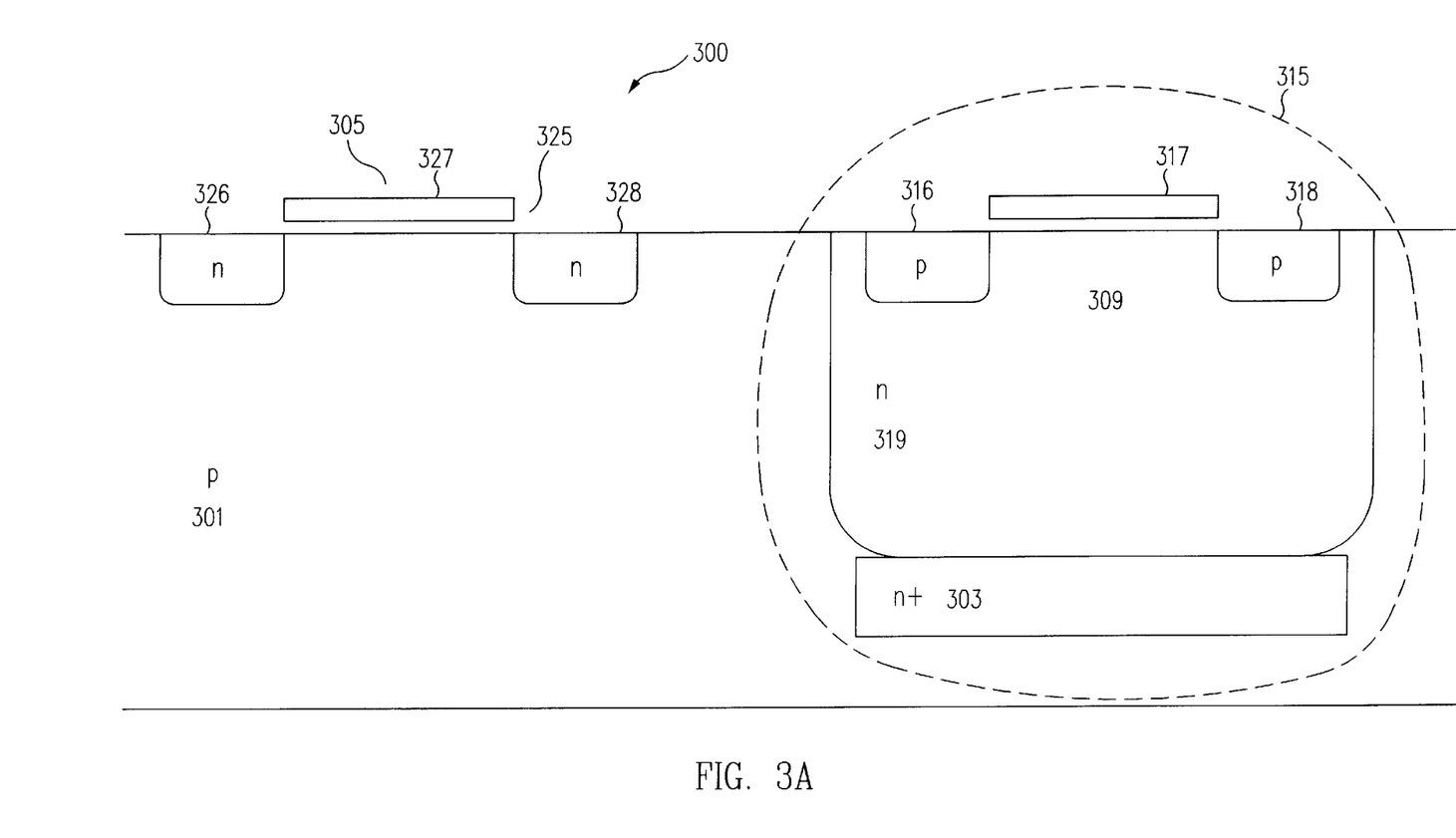
FIG. 3A shows one embodiment of a structure according to the invention including a platform PFET transistor formed in accordance with the principles of the invention, and a standard NFET.

The method and structure of the invention is not limited to use with NFETs and platform PFETs are designed according to the principles of the invention as well. FIG. 3A shows one embodiment of structure 300 including a platform PFET 315 formed in accordance with the principles of the invention, and a standard NFET 305.

As shown in FIG. 3A, structure 300 includes a P-type substrate 301. Standard NFET 325, including N-type source 326, N-type drain 328 and gate electrode 327 is formed in P-type substrate 301. In addition, according to the invention, an N-well 319 is also formed in P-type substrate 301 and platform PFET 315 is formed in and around N-well 319. Platform PFET 315 includes P-type source 316, P-type drain 318 and gate electrode 317. In addition, according to the invention, platform PFET 315 also includes buried platform N-well 303, positioned below platform PFET 315 and N-well 319. As seen in FIG. 3A, and in contrast to the prior art, buried platform N-well 303 does not necessarily connect with N-well 319 with any other structure, such as another N-well. Instead, according to the invention, buried platform N-well 303 lies beneath platform PFET 315 specifically to electrically interact with platform PFET 315, is an integral component of platform PFET 315, and is a tool to help engineer the threshold voltage of platform PFET 315.

Recall that, according to the prior art, the purpose of buried N-well 103 (FIG. 1A) was to connect N-type wells 119 and 139 of PFETs 115 and 135 with other N-type wells (not shown) and other PFETs (not shown) that were formed in prior art structure 100. Consequently, in the prior art, it was specifically taught to minimize and, if possible, eliminate all electrical interaction of buried N-well 103 with transistors 105, 115, 125, and 135. In other words, in the prior art, N-well 103 was not considered an element, or a factor, in the engineering the operation or threshold voltage of transistors 105, 115, 125 and 135. Further, recall that, in the prior art, great care was taken to use the correct energies and dopant concentrations in forming buried N-well 103 to try to obtain an ideal dopant concentration for buried N-well 103 (see FIG. 1B and the discussion above).

In contrast to the prior art, according to the invention, buried platform N-well 303 is specifically used to interact with platform PFET 315 and, in one embodiment, raise the threshold voltage of platform PFET 315 by introducing a tail dopant concentration distribution into the active region 309 of platform PFET 315. This tail dopant concentration increases the magnitude of the threshold voltage of platform PFET 315 by making active region 309 more negative. Further, according to the invention, the tail dopant concentration distribution is engineered to yield a desired threshold voltage for platform PFET 315. Consequently, according to the method and structure of the invention, the Gaussian dopant concentration distribution that was avoided, minimized, and considered undesirable, in the prior art, is used as an advantageous integral element of platform PFET 315.

Figure 3B:
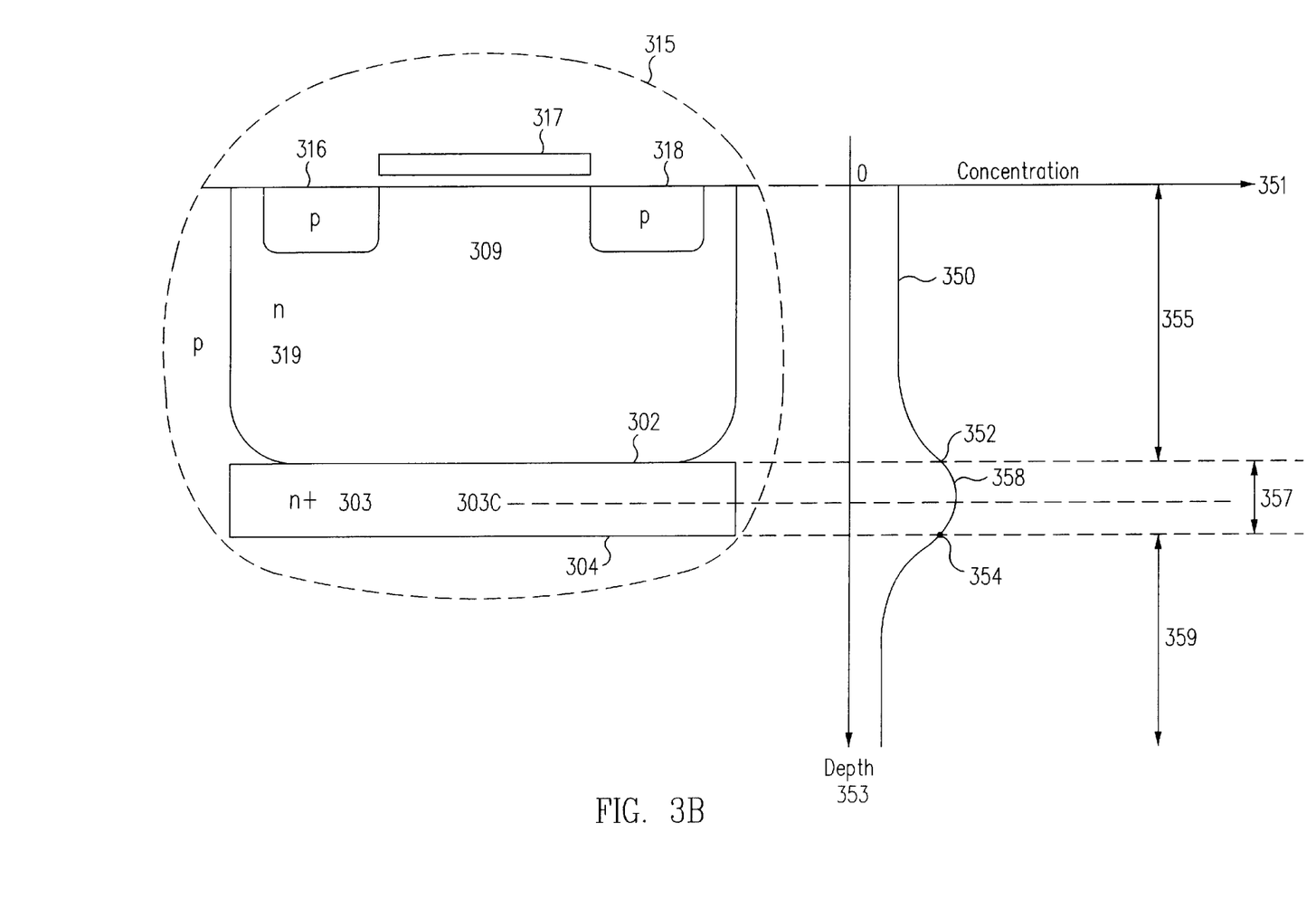
FIG. 3B shows one embodiment of a platform PFET transistor in accordance with the principles of the invention in detail along with a realistic graph of the dopant concentration, along the horizontal axis, versus the depth below the top surface of the PFET, along the vertical axis.

FIG. 3B shows platform PFET 315 of FIG. 3A in detail along with a graph of the dopant concentration, along the horizontal axis 351, versus the depth below the top surface 310 of platform PFET 315, along the vertical axis 353. FIG. 3B shows an engineered curve 350 of the dopant concentration distribution for platform PFET 315. As seen in FIG. 3B, there is a small dopant concentration in region 355 of curve 350, i.e., a dopant concentration tail exists in region 355.

According to the invention, and in contrast to the prior art, the dopant concentration in region 355 of curve 350 is desired and, in one embodiment, is engineered to provide specific results. In one embodiment of the invention, dopant (not shown) of a specific dose and energy is applied to provide the desired level of dopant concentration in region 355 of curve 350. This process is well known to those of skill in the art and the specific dose and energy employed will vary according to the desired results. These desired results can be further refined by: using multiple implants; varying the dose; varying the energy; changing dopant species; changing the dopant polarity; varying the implant angle; and varying the substrate temperature during implantation.

Regardless of the specific dopant concentration engineered in region 355 of curve 350, the dopant concentration typically increases with depth throughout region 355 and the first half of region 357 of curve 350, through and past the first surface 302 of buried platform N-well 303, to the depth of centerline 303C of buried platform N-well 303. The dopant concentration then typically reaches a peak 358 at a depth approximately equal to the depth of centerline 303C of buried platform N-well 303. After peak 358, the dopant concentration typically decreases with depth along curve 350 through the second half of region 357, and all of region 359, i.e., a dopant concentration tail exists in region 359.

As noted above, the Gaussian distribution of FIG. 1C was considered problematic in the prior art and considerable energy was spent trying to obtain a dopant concentration distribution closer to the graph of FIG. 1B than that of FIG. 1C or FIG. 3B. This was because, as discussed above, in the prior art, it was thought that ideally, there should be no interaction between buried N-well 103 and NFET 105.

In contrast, according to the present invention, the Gaussian distribution of FIG. 3B is specifically embraced and specifically engineered to electrically interact with platform PFET 315 and change the threshold voltage of platform PFET 315. For instance, for the embodiment shown in FIG. 3B, since platform PFET 315 is a PFET, if the dopant used is N-type, the dopant tail in region 355 of curve 350 raises the threshold voltage of platform PFET 315 by making active region 309 more negative. Consequently, buried platform N-well 303 is an integral component of platform PFET 315 and is used as a tool to engineer, i.e., raise, the threshold voltage of platform PFET 305.

As discussed above, according to the invention, buried platform N-well 203 is used to raise the threshold voltage of platform PFET 315. However, raising the threshold voltage of a device degrades performance at given supply voltage, requiring a higher supply voltage and therefore higher power to achieve the same performance. As also discussed above, raising the threshold voltage of a device, such as platform PFET 315, normally decreases standby power dissipation by decreasing device leakage. Consequently, it is often desirable to have a combination of low threshold devices and higher threshold devices in a single structure. Using the method and structure of the invention, this is readily accomplished as discussed above. To this end, platform PFET 315 can be used in conjunction with standard PFETs, as was done with NFETs 205 and 225 discussed above, to yield fast but leaky standard PFETs and slower, but stable, platform PFETs on a single structure.

Figure 4:
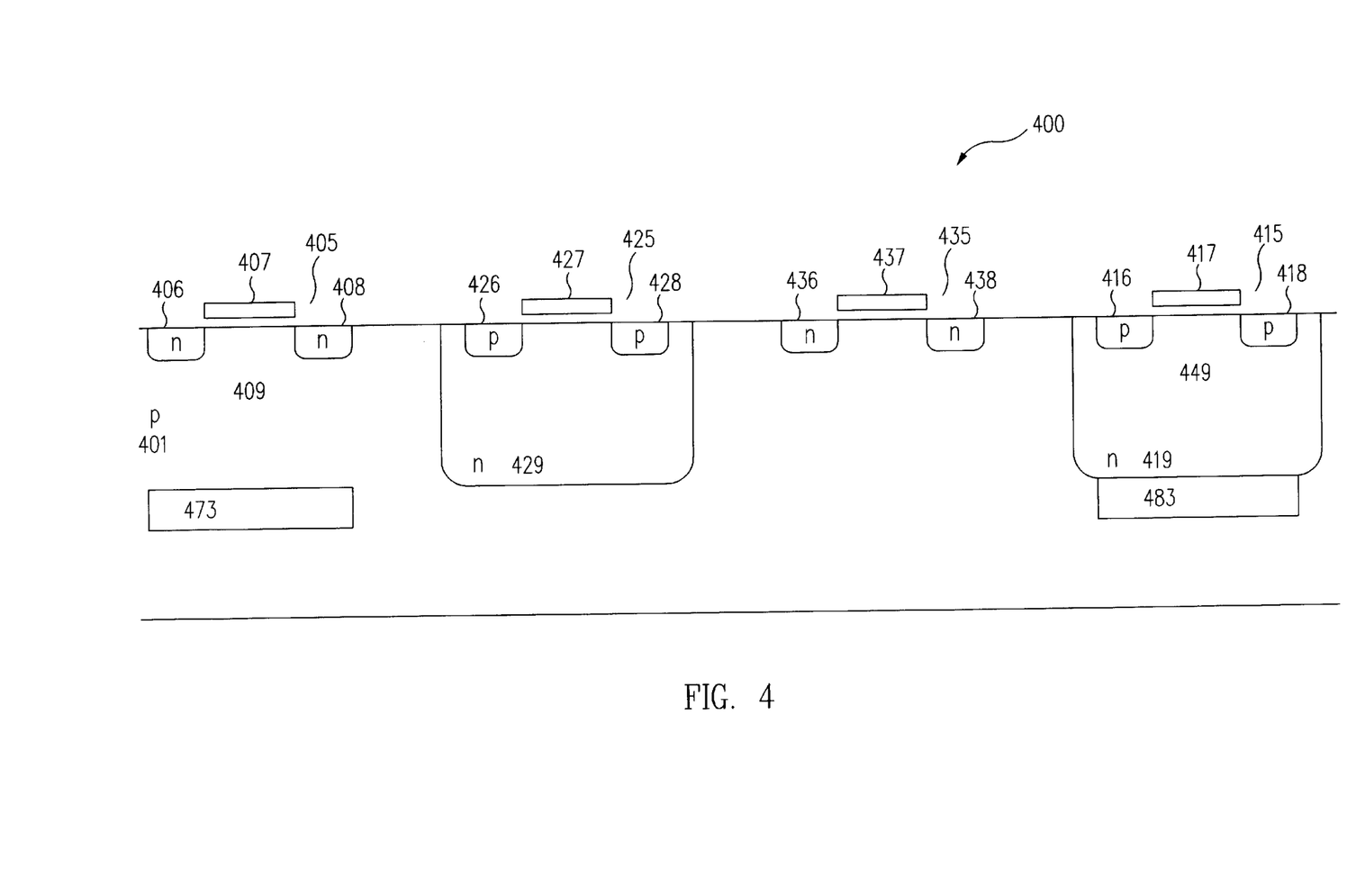
FIG. 4 shows a structure 400 including: a platform NFET transistor formed in accordance with the principles of the invention to have a first threshold voltage; a standard PFET having a second threshold voltage; a standard NFET having a third threshold voltage; and a platform PFET transistor, formed in accordance with the principles of the invention to have a fourth threshold voltage, in accordance with the principles of one embodiment the invention.

FIG. 4 shows a structure 400 including: platform NFET 405 formed in accordance with the principles of the invention to have a first threshold voltage; standard PFET 425 having a second threshold voltage; standard NFET 435 having a third threshold voltage; and platform PFET 415, formed in accordance with the principles of the invention to have a fourth threshold voltage. As seen in FIG. 4, structure 400 includes a P-type substrate 401. Platform NFET 405 is formed in P-type substrate 401 and includes N-type source 406, N-type drain 408, gate electrode 407, active region 409 and buried platform N-well 473. P-type substrate 401 also includes a first N-well 429 with standard PFET 425 formed in it. Standard PFET 425 includes P-type source 426, P-type drain 428 and gate electrode 427. A standard NFET 435 including N-type source 436, N-type drain 438 and gate electrode 437 is also formed in P-type substrate 401. In addition, platform PFET 415 is formed in N-well 419 and includes P-type source 416, P-type drain 418, gate electrode 417, active region 449 and buried platform N-well 483.

According to the embodiment of the invention shown in FIG. 4, by adding two buried platform N-wells, 473 and 483, structure 400 includes four transistors with up to four different threshold voltages. Consequently, by using the method and structure of the invention, considerable versatility and design flexibility are achieved with minimum structural complexity.

According to the prior art, the purpose of buried N-wells was to connect N-type wells of PFETs. Consequently, in the prior art, it was specifically taught to minimize and, if possible, eliminate all electrical interaction of the buried N-wells with the transistors in the structure. In other words, in the prior art, buried N-wells were not considered an element, or a factor, in engineering the operation or threshold voltage of transistors. Also, in the prior art, great care was taken to use the correct energies and dopant concentrations in forming buried N-wells to try to obtain an ideal dopant concentration pulse and avoid, or minimize, Gaussian dopant concentration distributions.

In contrast to the structures and teachings of the prior art, the present invention includes a method and structure for using buried platform wells specifically to electrically interact with the platform transistors of the invention. According to the invention, the dopant concentration distribution of the buried platform wells is used to change the threshold voltage of the platform transistors of the invention by introducing a tail dopant concentration into the active region of the platform transistors.

Further, according to the invention, the tail dopant concentration distribution can be engineered to yield a desired threshold voltage for the platform transistor and this threshold voltage can be varied from transistor to transistor. Consequently, according to the method and structure of the invention, the Gaussian dopant concentration distribution that was avoided, minimized, and generally considered undesirable, in the prior art is used as an advantageous integral element of the platform transistors of the invention.

The platform transistors of the invention can also be used in conjunction with standard transistors, on a single structure, to provide both relatively low and relatively high threshold voltage transistors on a single structure. As a result of these and other features discussed in more detail above, devices designed according to the principles of the present invention have the desirable attributes of multiple threshold voltages that can be engineered to yield specific results and, using the method and structure of the invention, considerable versatility and design flexibility are achieved with minimum additional structural complexity.

This Application is related to: U.S. Pat. No. 5,773,863 entitled "Low Power, High Performance Junction Transistor"; U.S. Pat. No. 5,780,912 entitled "Asymmetric Low Power MOS Devices "; U.S. Pat. No. 5,622,880 entitled "Method of Making a Low Power, High Performance Junction Transistor"; U.S. Pat. No. 5,753,958 entitled "Back-Biasing in Asymmetric MOS Devices"; U.S. Pat. No. 5,650,340 entitled "Method for Making Asymmetric Low Power Devices"; U.S. Pat. No. 5,719,422, entitled "Low Threshold Voltage, High Performance Junction Transistor"; U.S. Pat. No. 6,137,142 entitled "MOS Device Structure and Method for Reducing PN Junction Leakage"; U.S. Pat. No. 6,110,783 entitled "Method for Forming a Notched Gate electrode Asymmetric MOS Device"; U.S. Pat. No. 6,121,666 entitled "Split Gate Oxide Asymmetric MOS Device"; U.S. Pat. No. 6,093,951 entitled "MOS Devices With Retrograde Pocket Regions"; U.S. Pat. No. 5,985,727 entitled "Method for Forming MOS Devices with Retrograde Pocket Regions and Counter Dopant Regions Buried in the Substrate Surface"; U.S. Pat. No. 5,923,987 entitled "Method for Forming MOS Devices with Retrograde Pocket Regions and Counter Dopant Regions Buried in the Substrate Surface"; U.S. Pat. No. 5,942,781 entitled "Tunable Threshold SOI Device Using Back Gate Well"; U.S. Pat. No. 6,100,567 entitled "Tunable Threshold SOI Device Using Back Gate and Intrinsic Channel Region"; U.S. Pat. No. 6,072,217 entitled "Tunable Threshold Device Using Isolated Well Structure for Back Gate"; U.S. Pat. No. 6,048,746 entitled "Methods for Making Die-Compensated Threshold Tuning Circuit"; U.S. Pat. No. 6,087,892 entitled "Target Ion/Ioff Threshold Tuning Circuit and Method"; U.S. Pat. No. 5,998,850 entitled "Tunable Field Plate"; U.S. Pat. No. 6,091,283 entitled "Sub-Threshold Leakage Tuning Circuit"; U.S. Pat. No. 5,471,421 entitled "Storage Cell Using Low Powered/Low Threshold CMOS Pass Transistors Having Reduced Charge Leakage"; U.S. Pat. No. 5,581,500 entitled "Memory Cell with Power Supply Induced Reversed-Bias Pass Transistors for Reducing Off-Leakage Current"; U.S.

Pat. No. 5,566,120 entitled "Apparatus and Method for Controlling Transistor Current Leakage"; U.S. Pat. No. 6,606,270 entitled "Dynamic Clocked Inverter Latch with Reduced Charge Leakage"; U.S. Pat. No. 5,612,645 entitled "Dynamic MOSFET Threshold Voltage Controller"; U.S. Pat. No. 5,640,115 entitled "Self-Enabling Latch"; and U.S. patent application Ser. No. 09/030,030, now allowed, entitled "Back biased MOS Device and Method" all of which are assigned to the assignee of the present invention and are incorporated herein, in their entirety, by reference for all purposes.

The foregoing description of an implementation of the invention has been presented for purposes of illustration and description, and therefore is not exhaustive and does not limit the invention to the precise form disclosed. Modifications and variations are possible in light of the above teachings or may be acquired from practicing the invention.

For example, the discussion above is largely directed to P-process devices, however, those of skill will recognize that the discussion above is equally applicable to N-process devices with minor and well-known modifications.

In addition, the discussion above was largely directed to methods and structures using N-type dopant. However, those of skill in the art will readily recognize that, with minor modifications, P-type dopant could be used for similar, if opposite, affect.

Consequently, the scope of the invention is defined by the claims and their equivalents.

What is claimed is:

1. A method for engineering the threshold voltage of a device, said method comprising:
   providing a substrate comprising a P-type bulk material, said substrate having a top surface and a bottom surface;
   forming a first NFET transistor in said substrate, said first NFET transistor comprising:
      a first N-type source region formed in said substrate;
      a first N-type drain region formed in said substrate;
      a first active region between and below said first N-type source and said first N-type drain;
      a first gate electrode formed over said first active region, wherein;
         said first NFET has a first threshold voltage; and
   forming a second NFET transistor in said substrate, said second NFET transistor comprising:
      a second N-type source region formed in said substrate;
      a second N-type drain region formed in said substrate;
      a second active region between and below said second N-type source and said second N-type drain;
      a second gate electrode formed over said active region; and
      a buried platform well formed below said second active region, wherein;
         said buried platform well is specifically formed such that a portion of dopant comprising said buried platform well is implanted in said second active region, thereby intentionally changing a second threshold voltage of said second NFET transistor with respect to said first threshold voltage of said first NFET transistor.

2. The method of claim 1, wherein;
   said buried platform well is an N-well, further wherein; and said second threshold voltage of said second NFET transistor is intentionally lowered with respect to said first threshold voltage of said first NFET transistor by the formation of said buried platform N-well.

3. A method for engineering the threshold voltage of a device, said method comprising:
   providing a substrate comprising a P-type bulk material, said substrate having a top surface and a bottom surface;
   forming a first platform NFET transistor in said substrate, said first platform NFET transistor comprising:
      a first N-type source region formed in said substrate;
      a first N-type drain region formed in said substrate;
      a first active region between and below said first N-type source and said first N-type drain;
      a first gate electrode formed over said first active region; and
      a first buried platform well formed below said first active region, wherein;
         said first buried platform well is specifically formed such that a portion of dopant comprising said first buried platform well is implanted in said first active region, thereby intentionally changing a first threshold voltage of said first platform NFET transistor;
   forming a second platform NFET transistor in said substrate, said second platform NFET transistor comprising:
      a second N-type source region formed in said substrate;
      a second N-type drain region formed in said substrate;
      a second active region between and below said second N-type source and said second N-type drain;
      a second gate electrode formed over said active region; and
      a second buried platform well formed below said second active region, wherein;
         said second buried platform well is specifically formed such that a portion of dopant comprising said second buried platform well is implanted in said second active region, thereby intentionally changing a second threshold voltage of said second platform NFET transistor.

4. The method of claim 3, wherein;
   said first buried platform well is an N-well, further wherein;
      said first buried platform N-well is formed below said first active region to intentionally lower said first threshold voltage of said first platform NFET transistor.

5. The method of claim 4, wherein;
   said second buried platform well is an N-well, further wherein;
      said second buried platform N-well is formed below said second active region to intentionally lower said second threshold voltage of said second platform NFET transistor.

6. The method of claim 5, wherein;
   said first threshold voltage of said first platform NFET transistor is engineered to be different from said second threshold voltage of said second platform NFET transistor.

7. A method for engineering the threshold voltage of a device, said method comprising:
   providing a substrate comprising a P-type bulk material, said substrate having a top surface and a bottom surface;
   forming a first platform NFET transistor in said substrate, said first platform NFET transistor comprising:
      a first N-type source region formed in said substrate;
      a first N-type drain region formed in said substrate;

a first active region between and below said first N-type source and said first N-type drain;
a first gate electrode formed over said first active region; and
a first buried platform N-well formed below said first active region, wherein;
said first buried platform N-well is specifically formed such that a portion of dopant comprising said first buried platform N-well is implanted in said second active region, thereby intentionally lowering a threshold voltage of said first platform NFET transistor to a first threshold voltage;

forming a second platform NFET transistor in said substrate, said second platform NFET transistor comprising:
a second N-type source region formed in said substrate;
a second N-type drain region formed in said substrate;
a second active region between and below said second N-type source and said second N-type drain;
a second gate electrode formed over said active region; and
a second buried platform N-well formed below said second active region, wherein;
said second buried platform N-well is specifically formed such that a portion of dopant comprising said second buried platform N-well is implanted in said second active region, thereby intentionally lowering a threshold voltage of said second platform NFET transistor to a second threshold voltage, further wherein;
said first threshold voltage is engineered to be different form said second threshold voltage.

8. A method for engineering the threshold voltage of a device, said method comprising:
providing a substrate comprising a P-type bulk material, said substrate having a top surface and a bottom surface;
forming a first N-well in said substrate;
forming a first PFET transistor in said first N-well, said first PFET transistor comprising:
a first P-type source region formed in said first N-well;
a first P-type drain region formed in said first N-well;
a first active region in said first N-well between and below said first P-type source and said first P-type drain;
a first gate electrode formed over said first active region, wherein;
said first PFET has a first threshold voltage; and
forming a second N-well in said substrate;
forming a second PFET transistor in said second N-well, said second PFET transistor comprising:
a second P-type source region formed in said second N-well;
a second P-type drain region formed in said second N-well;
a second active region in said second N-well between and below said second P-type source and said second P-type drain;
a second gate electrode formed over said second active region; and
a buried platform well formed below said second active region, wherein;
said buried platform well is specifically formed such that a portion of dopant comprising said buried platform well is implanted in said second active region, thereby intentionally changing a second threshold voltage of said second PFET transistor with respect to said first threshold voltage of said first PFET transistor.

9. The method of claim 8, wherein;
said buried platform well is an N-well, further wherein;
said second threshold voltage of said second PFET transistor is intentionally raised with respect to said first threshold voltage of said first PFET transistor.

10. A method for engineering the threshold voltage of a device, said method comprising:
providing a substrate comprising a P-type bulk material, said substrate having a top surface and a bottom surface;
forming a first N-well in said substrate;
forming a first platform PFET transistor in said first N-well, said first platform PFET transistor comprising:
a first P-type source region formed in said first N-well;
a first P-type drain region formed in said first N-well;
a first active region in said first N-well between and below said first P-type source and said first P-type drain;
a first gate electrode formed over said first active region; and
a first buried platform well formed below said first active region, wherein;
said first buried platform well is specifically formed such that a portion of dopant comprising said first buried platform well is implanted in said first active region, thereby intentionally changing a first threshold voltage of said first platform PFET transistor;
forming a second N-well in said substrate: forming a second platform PFET transistor in said second N-well, said second platform PFET transistor comprising:
a second P-type source region formed in said second N-well;
a second P-type drain region formed in said second N-well;
a second active region in said second N-well between and below said second P-type source and said second P-type drain;
a second gate electrode formed over said second active region; and
a second buried platform well formed below said second active region, wherein;
said second buried platform well is specifically formed such that a portion of dopant comprising said second buried platform well is implanted in said second active region, thereby intentionally changing a second threshold voltage of said second platform PFET transistor.

11. The method of claim 10, wherein;
said first buried platform well is an N-well, further wherein;
said first threshold voltage of said first platform PFET transistor is intentionally raised by the formation of said first buried platform N-well.

12. The method of claim 11, wherein;
said second buried platform well is an N-well, further wherein;
said second threshold voltage of said second PFET transistor is intentionally raised by the formation of said second buried platform N-well.

13. The method of claim 12, wherein;
said first threshold voltage of said first platform PFET transistor is engineered to be different from said second threshold voltage of said second platform PFET transistor.

14. A method for engineering the threshold voltage of a device, said method comprising:
providing a substrate comprising a P-type bulk material, said substrate having a top surface and a bottom surface;
forming a first N-well in said substrate;
forming a first platform PFET transistor in said first N-well, said first platform PFET transistor comprising:
a first P-type source region formed in said first N-well;
a first P-type drain region formed in said first N-well;
a first active region in said first N-well between and below said first P-type source and said first P-type drain;
a first gate electrode formed over said first active region; and
a first buried platform N-well formed below said first active region, wherein;
said first buried platform N-well is specifically formed such that a portion of dopant comprising said first buried platform N-well is implanted in said first active region, thereby intentionally raising a first threshold voltage of said first PFET transistor;
forming a second N-well in said substrate;
forming a second platform PFET transistor in said second N-well, said second platform PFET transistor comprising:
a second P-type source region formed in said second N-well;
a second P-type drain region formed in said second N-well;
a second active region in said second N-well between and below said second P-type source and said second P-type drain;
a second gate electrode formed over said second active region; and
a second buried platform N-well formed below said second active region, wherein;
said second buried platform N-well is specifically formed such that a portion of dopant comprising said second buried platform N-well is implanted in said second active region, thereby intentionally raising a second threshold voltage of said second PFET transistor, further wherein;
said first threshold voltage is engineered to be different form said second threshold voltage.

15. A method for engineering the threshold voltage of a device, said method comprising:
providing a substrate comprising a P-type bulk material, said substrate having a top surface and a bottom surface;
forming a first NFET transistor in said substrate, said first NFET transistor comprising:
a first N-type source region formed in said substrate;
a first N-type drain region formed in said substrate;
a first active region between and below said first N-type source and said first N-type drain;
a first gate electrode formed over said first active region, wherein;
said first NFET has a first threshold voltage;
forming a second NFET transistor in said substrate, said second NFET transistor comprising:
a second N-type source region formed in said substrate;
a second N-type drain region formed in said substrate;
a second active region between and below said second N-type source and said second N-type drain;
a second gate electrode formed over said active region; and
a first buried platform well formed below said second active region, wherein;
said first buried platform well is specifically formed such that a portion of dopant comprising said first buried platform well is implanted in said second active region, thereby intentionally changing a second threshold voltage of said second NFET transistor with respect to said first threshold voltage of said first NFET transistor;
forming a first N-well in said substrate;
forming a first PFET transistor in said first N-well, said first PFET transistor comprising:
a first P-type source region formed in said first N-well;
a first P-type drain region formed in said first N-well;
a third active region in said first N-well between and below said first P-type source and said first P-type drain;
a third gate electrode formed over said third active region, wherein;
said first PFET transistor has a third threshold voltage;
forming a second N-well in said substrate;
forming a second PFET transistor in said second N-well, said second PFET transistor comprising:
a second P-type source region formed in said second N-well;
a second P-type drain region formed in said second N-well;
a fourth active region in said second N-well between and below said second P-type source and said second P-type drain;
a fourth gate electrode formed over said fourth active region; and
a second buried platform well formed below said fourth active region, wherein;
said second buried platform well is specifically formed such that a portion of dopant comprising said second buried platform well is implanted in said fourth active region, thereby intentionally changing a fourth threshold voltage of said second PFET transistor with respect to said third threshold voltage of said first PFET transistor.

16. The method of claim 15, wherein;
said first buried platform well is an N-well, further wherein;
said second threshold voltage of said second NFET transistor is intentionally lowered with respect to said first threshold voltage of said first NFET transistor by the formation of said first buried platform N-well.

17. The method of claim 16, wherein;
said second buried platform well is an N-well, further wherein;
said fourth threshold voltage of said second PFET transistor is intentionally raised with respect to said third threshold voltage of said first PFET transistor by the formation of said second buried platform well.

18. A method for engineering the threshold voltage of a device, said method comprising:
providing a substrate comprising a P-type bulk material, said substrate having a top surface and a bottom surface;
forming a first NFET transistor in said substrate, said first NFET transistor comprising:

a first N-type source region formed in said substrate;
a first N-type drain region formed in said substrate;
a first active region between and below said first N-type source and said first N-type drain; and
a first gate electrode formed over said first active region, wherein;
said first NFET has a first threshold voltage;

forming a second NFET transistor in said substrate, said second NFET transistor comprising:
a second N-type source region formed in said substrate;
a second N-type drain region formed in said substrate;
a second active region between and below said second N-type source and said second N-type drain;
a second gate electrode formed over said active region; and
a first buried platform N-well formed below said second active region, wherein;
said first buried platform N-well is specifically formed such that a portion of dopant comprising said first buried platform well is implanted in said second active region, thereby intentionally lowering a second threshold voltage of said second NFET transistor with respect to said first threshold voltage of said first NFET transistor;

forming a first N-well in said substrate;

forming a first PFET transistor in said first N-well, said first PFET transistor comprising:
a first P-type source region formed in said first N-well;
a first P-type drain region formed in said first N-well;
a third active region in said first N-well between and below said first P-type source and said first P-type drain;
a third gate electrode formed over said third active region, wherein;
said first PFET has a third threshold voltage;

forming a second N-well in said substrate;

forming a second PFET transistor in said second N-well, said second PFET transistor comprising:
a second P-type source region formed in said second N-well;
a second P-type drain region formed in said second N-well;
a fourth active region in said second N-well between and below said second P-type source and said second P-type drain;
a fourth gate electrode formed over said fourth active region; and
a second buried platform N-well formed below said fourth active region, wherein;
said second buried platform N-well is specifically formed such that a portion of dopant comprising said second buried platform N-well is implanted in said fourth active region, thereby intentionally raising a fourth threshold voltage of said second PFET transistor with respect to said third threshold voltage of said first PFET transistor.

* * * * *